United States Patent [19]

van de Ven et al.

[11] Patent Number: 5,374,594
[45] Date of Patent: Dec. 20, 1994

[54] GAS-BASED BACKSIDE PROTECTION DURING SUBSTRATE PROCESSING

[75] Inventors: Everhardus P. van de Ven, Cupertino; Eliot K. Broadbent; Jeffrey C. Benzing, both of San Jose; Barry L. Chin, Sunnyvale; Christopher W. Burkhart, San Jose, all of Calif.

[73] Assignee: Novellus Systems, Inc., San Jose, Calif.

[21] Appl. No.: 7,457

[22] Filed: Jan. 22, 1993

Related U.S. Application Data

[62] Division of Ser. No. 554,225, Jul. 16, 1990, Pat. No. 5,230,741.

[51] Int. Cl.$^5$ .................. H01L 21/205; C23C 16/46
[52] U.S. Cl. .................. 437/247; 29/25.01; 29/25.02; 148/DIG. 6; 437/245; 437/248
[58] Field of Search .......... 437/245, 248, 247; 118/725, 728, 715, 719, 720; 148/DIG. 6; 29/25.01, 25.02

[56] References Cited

U.S. PATENT DOCUMENTS

| | | | |
|---|---|---|---|
| 4,261,762 | 4/1981 | King | 148/1.5 |
| 4,457,359 | 7/1984 | Holden | 165/80 C |
| 4,508,161 | 4/1985 | Holden | 165/1 |
| 4,512,391 | 4/1985 | Harra | 165/48 R |
| 4,527,620 | 7/1985 | Pedersen et al. | 165/800 |
| 4,535,834 | 8/1985 | Turner | 165/800 |
| 4,567,938 | 2/1986 | Turner | 165/80 R |
| 4,575,408 | 3/1986 | Bok | 204/192 E |
| 4,603,466 | 8/1986 | Morley | 29/569 R |
| 4,682,566 | 7/1987 | Aitken | 118/724 |
| 4,687,682 | 8/1987 | Koze | 437/238 |
| 4,709,655 | 12/1987 | Van Mastright | 118/719 |
| 4,743,570 | 5/1988 | Lamont, Jr. | 437/248 |
| 4,817,558 | 4/1989 | Itoh | 118/725 |
| 4,857,142 | 8/1989 | Syverson | 156/646 |
| 4,911,103 | 3/1990 | Davis et al. | 118/725 |
| 4,990,374 | 2/1991 | Keeley et al. | 427/225.1 |
| 5,000,113 | 3/1991 | Wang et al. | 118/723 |
| 5,033,407 | 7/1991 | Mizuno et al. | 118/725 |
| 5,033,538 | 7/1991 | Wagner et al. | 165/80.1 |
| 5,094,885 | 3/1992 | Selbrede | 427/248.1 |

FOREIGN PATENT DOCUMENTS

| | | |
|---|---|---|
| 0291181A2 | 4/1988 | European Pat. Off. . |
| 2559953 | 2/1985 | France . |
| 3633386A1 | 4/1988 | Germany . |
| 60-136314 | 7/1985 | Japan . |
| 1178122 | 7/1989 | Japan . |

OTHER PUBLICATIONS

Benveniste, "Wafer Cooling in High Current Ion Implanter," Nuclear Instruments and Methods in Physics Research B21, North-Holland, Amsterdam, 1987, pp. 366–371.

Bogle-Rohwer et al., "Wall Profile Control in a Triode Etcher," Solid State Technology, Apr. 1985, pp. 251–255.

(List continued on next page.)

Primary Examiner—Olik Chaudhuri
Assistant Examiner—Ken Horton
Attorney, Agent, or Firm—Skjerven, Morrill, MacPherson, Franklin & Friel

[57] ABSTRACT

A suitable inert gas such as argon or a mixture of inert and reactive gases such as argon and hydrogen is introduced onto the backside of wafers being processed in a CVD reactor during the deposition of tungsten or other metals, metal nitrides and silicides, to avoid deposition of material on the backside of the wafers being processed. Each process station includes a gas dispersion head disposed over a platen. A vacuum chuck including a number of radial and circular vacuum grooves in the top surface of the platen is provided for holding the wafer in place. A platen heater is provided under the platen. Backside gas is heated in and about the bottom of the platen, and introduced through a circular groove in the peripheral region outside of the outermost vacuum groove of the vacuum chuck. Backside gas pressure is maintained in this peripheral region at a level greater than the CVD chamber pressure. In this manner, backside gas vents from beneath the edge of the wafer on the platen and prevents the process gas from contacting the wafer backside.

16 Claims, 9 Drawing Sheets

OTHER PUBLICATIONS

Douglas-Hamilton et al., "End Station Design and Wafer Quality Control For A High Current Oxygen Implantation," Nuclear Instruments and Methods in Physics Research B21, North-Holland, Amsterdam, 1987, pp. 324–327.

Egerton et al., "Positive Wafer Temperature Control to Increase Dry Etch Throughout and Yield," Solid State Technology, Aug. 1982, pp. 84–87.

Evans, "A Generalized Mathematical Model For Wafer Cooling With Gas," Nuclear Instruments and Methods in Physics Research B21, North-Holland, Amsterdam, 1987, pp. 385–390.

Hammer, "Cooling Ion Implantation Target," IBM Technical Disclosure Bulletin, vol. 19, No. 6, Nov. 1976, pp. 2270–2271.

Hoffman et al., "Individual Wafer Metallization Utilizing Load-Locked, Close-Coupled Conical Magnetron Sputtering," Solid State Technology, Feb. 1981, pp. 105–111 and 120.

Hussla et al., "In Situ Silicon-Wafer Temperature Measurements During RF Argon-Ion Plasma Etching via Fluoroptic Thermometry," J. Phys. D: Appl. Physc. 20, 1987, pp. 889–896.

Kawai et al., "PR-80 High Current Ion Implantation Machine," Nuclear Instruments and Methods in Physics Research B21, North-Holland, Amsterdam, 1987, pp. 239–244.

King et al., "Experiments On Gas Cooling of Wafers," Nuclear Instruments and Methods 189, North-Holland Publishing Company, 1981, pp. 169–173.

Komatsu et al., "A High Throughput End Station of A High Current Ion Implantation," Nuclear Instruments and Methods in Physics Research B21, North-Holland, Amserdam, 1987, pp. 317–320.

Mack, "Wafer Cooling in Ion Implantation," In Ion Implantation: Equipment and Techniques, H. Ryssel and H. Glawischnig, eds., Springer-Verlag, Berlin, 1983, pp. 221–232.

Mathod, "Design Consideration For A High Pressure, High Etch Rate Single Wafer Reactor," The Electrochemical Society, Proceedings of the Sixth Symposium on Plasma Processing, vol. 87-6, 1987, pp. 134–138.

Mears, "New Method of Solid State Wafer Cooling in the Extron 1000 High Current Ion Implantation System," Nuclear Instruments and Methods in Physics Research B37/38, North-Holland, Amsterdam, 1989, pp. 460–463.

Nakamura et al., "The Effect of Wafer Temperature on Reactive Ion Etching," The Electro-Chemical Society, Proceedings of the Symposium on Dry Process, vol. 88-7, 1988, pp. 78–85.

Ryding, "Target Chambers For Ion Implantation Using Mechanical Scanning," Nuclear Instruments and Methdos 189, North-Holland Publishing Company, 1981, pp. 239–251.

Ryssel et al., "Ion Implantation," John Wiley & Sons, Chichester, 1986, pp. 152–160.

Saitoh, et al., "Impurity Gettering of Polycrystalline Solar Cells Fabricated from Refined Metallurgical—Grade Silicon," IEEE Transactions on Electron Devices, vol. Ed-27, No. 4, Apr. 1980, pp. 671–677.

Scaife, "The Veeco 4840 Automatic Implant System," Nuclear Instruments and Methods in Physics Research B21, North-Holland, Amsterdam, 1987, pp. 258–263.

Steen, et al., "The Precision Implant 9000, A New Concept In Ion Implantation Systems," Nuclear Instruments and Methods in Physics Research B21, North-Holland, Amsterdam, 1987, pp. 328–333.

Syverson et al., "Contamination Aspects of Anhydrous HF Gas Processing," Solid State Technology, Oct. 1988, pp. 101–104.

Taylor et al., "200 mm End Station For Ion Beam Implanters," Nuclear Instruments and Methods in Physics Research B21, North-Holland, Amsterdam, 1987, pp. 224–228.

Turner et al., "Advances in Cassette-to-Cassette Sputtercoating Systems," Solid State Technology, Jul. 1983, pp. 115–123.

Wauk, "New Ion Implantation System With Advanced Process Capabilities," Nuclear Instruments and Methods in Physics Research B21, North-Holland, Amsterdam, 1987, pp. 280–284.

VLSI Research Inc., "Integrated Processing Systems," Nov. 1990, p. 12.

GAS-BASED BACKSIDE PROTECTION DURING SUBSTRATE PROCESSING

This application is a division of application Ser. No. 07/554,225, filed Jul. 16, 1990, now U.S. Pat. No. 5,230,741.

BACKGROUND OF THE INVENTION

1. Field of the Invention

This invention relates to semiconductor processing, and more particularly to the protection of the backside of wafers during semiconductor processing operations.

2. Description of Related Art

Chemical vapor deposition ("CVD") is a gas reaction process commonly used in the semiconductor industry to form thin layers of material known as films over an integrated circuit substrate. The CVD process is based on the thermal, plasma, or thermal and plasma decomposition and reaction of selected gases. The most widely used CVD films are silicon dioxide, silicon nitride, and polysilicon, although a wide variety of CVD films suitable for insulators and dielectrics, semiconductors, conductors, superconductors, and magnetics are well known.

Particulate contamination of CVD films must be avoided. A particularly troublesome source of particulates in the chemical vapor deposition of metals and other conductors such as tungsten, tungsten silicide, and titanium nitride, is the film that forms on the backside of the wafer under certain conditions. For example, if the wafer backside is unprotected or inadequately protected during deposition, a partial coating of the CVD material forms on the wafer backside. This partial coating tends to peel and flake easily for some types of materials, introducing particulates into the chamber during deposition and subsequent handling steps.

Many approaches have been developed for addressing the problem of material deposition on the wafer backside. In one approach, the material is permitted to form on the backside, but then is removed immediately following the deposition step using an in-situ plasma etch. This approach entails additional process steps and requires additional equipment capabilities, and also affects the flatness of the wafer. In another approach, the wafer is clamped onto a substrate holder in an attempt to seal and isolate the backside region from the CVD gas. An adequate seal tends to be difficult to achieve in practice, and the mechanical motion between the clamp and the wafer itself causes particulates. Yet another approach is disclosed in U.S. Pat. No. 4,817,558, issued Apr. 4, 1989 to Itoh. A substrate support member having the form of a cylinder is provided with a flat bearing surface on which the wafer rests. Three pins protrude from the peripheral edge portion of the bearing surface. The sidewalls of the shield are insulated from the reactive gases by a cover, which is further provided with a lifted and bent region that surrounds the substrate at the level of the substrate. The lifted and bent region is said to trap the reactive gas on the lateral face of the wafer, thereby preventing a film from being deposited on the wafer backside.

SUMMARY OF THE INVENTION

Undesirable deposition of materials on the wafer backside is diminished in the present invention, which in one embodiment is a method in which the substrate is restrained and a process gas comprising a mixture of a reactant gas and a carrier gas is introduced at a preselected pressure into the process chamber. A backside gas comprising a mixture of a reactant gas and an inert gas is introduced to the periphery of the substrate backside, and a positive pressure differential is maintained between the pressure at the periphery of the substrate backside and the pressure in the process chamber. In a variation of this embodiment, the process gas comprises the product reactant $WF_6$, the reactant gas hydrogen, and the carrier gas argon or a mixture of inert gases, while the backside gas comprises the reactant gas hydrogen and the inert gas argon or a mixture of inert gases.

BRIEF DESCRIPTION OF THE DRAWINGS

In the drawings, in which like reference numerals refer to like parts.

DESCRIPTION OF THE PREFERRED EMBODIMENT

Figure 1:
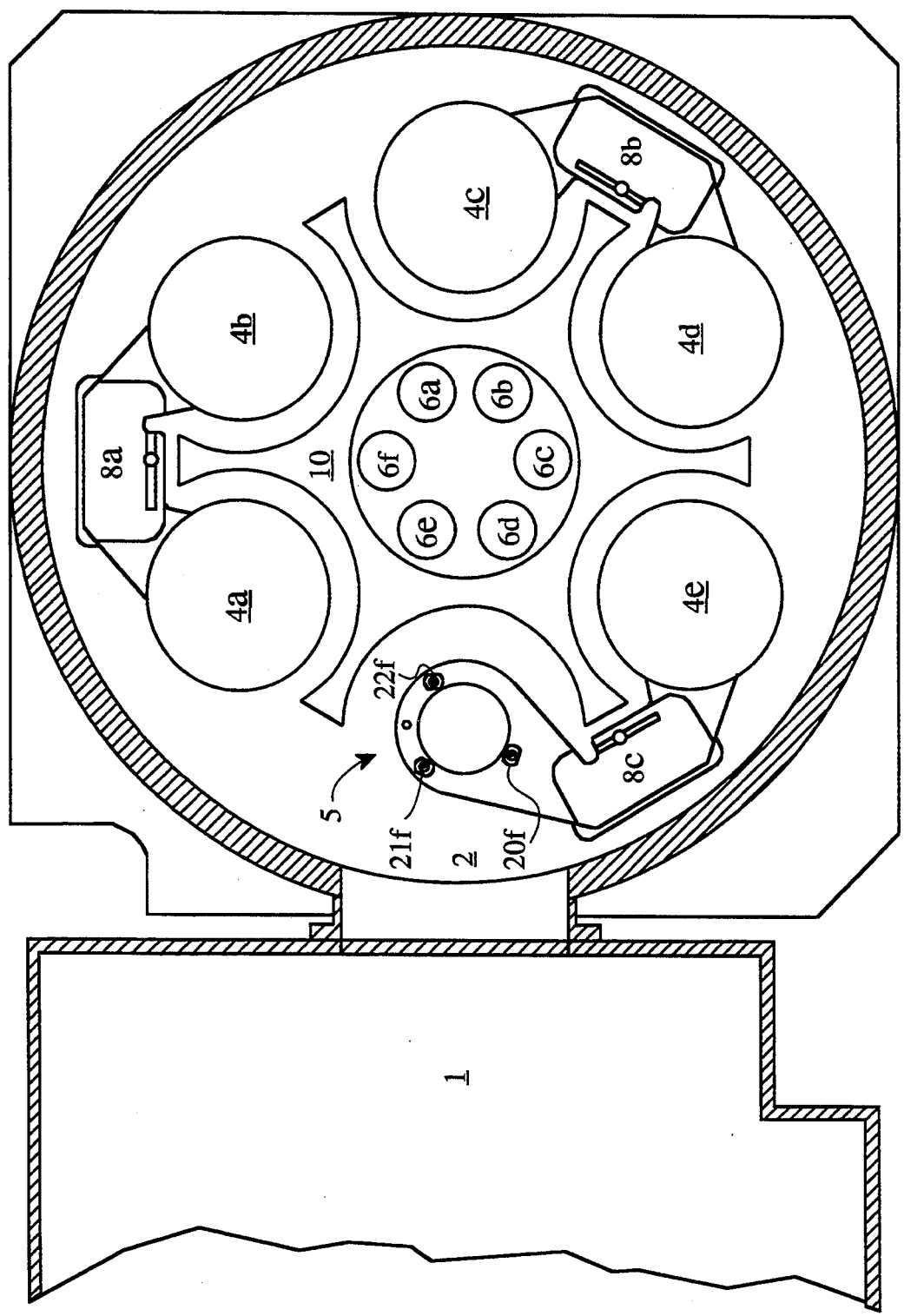
FIG. 1 is a cut away plan view of a process chamber for a chemical vapor deposition system, as viewed from above.
Figure 2:
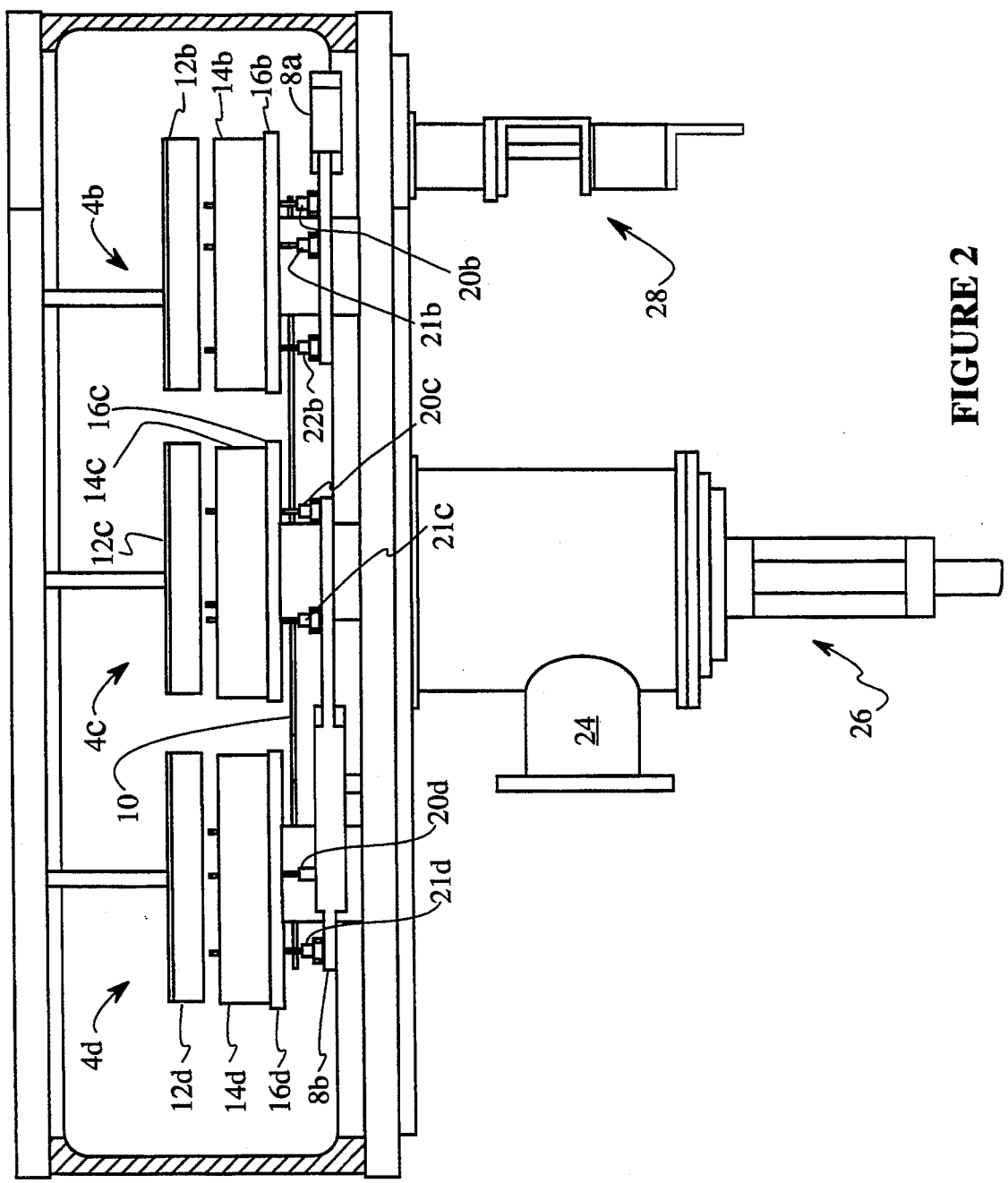
FIG. 2 is a cut away plan view of the process chamber of FIG. 1, as viewed from a side.

An illustrative reaction chamber of a high pressure chemical vapor deposition ("CVD") apparatus is shown from a top view in FIG. 1, and from a side view in FIG. 2. The process chamber 2 communicates with a load lock chamber 1, from which wafers to be processed are introduced into the process chamber 2, and into which processed wafers are received from the process chamber 2. Within process chamber are five wafer process stations 4a-4e and a wafer load/unload station 5. Chamber gases are exhausted through vent ports 6a-6f. The system for moving wafers from station to station in the chamber 2 includes pin lift platforms 8a-8c and wafer transport mechanism 10. Also shown in FIG. 2 are a vacuum exhaust port 24, a spindle lift/rotation mechanism 26, and a pin lift mechanism 28, the design of which are well known in the art.

Wafer process stations 4b, 4c and 4d are visible in more detail in the side view of FIG. 2. Process station 4c, for example, includes a dispersion head 12c for introducing a process gas or gas mixture over a wafer to be processed; a platen 14c for supporting the wafer to be processed; a pedestal base 16c, which includes a heater for heating platen 14c and indirectly supplying heat to the wafer to be processed; and pin lift platform 8b, which is associated with pins 20c, 21c and 22c (hidden) for lifting and lowering the wafer to be processed in coordination with activation of the wafer transport mechanism 10. Similarly, process station 4b includes gas dispersion head 12b, platen 14b, pedestal base 16b, and pin lift platform 8a in association with pins 20b, 21b and 22b. Similarly, process station 4d includes gas dispersion head 12d, platen 14d, pedestal base 16d, and pin lift platform 8b in association with pins 20d, 21d and 22d (hidden).

Figure 3:
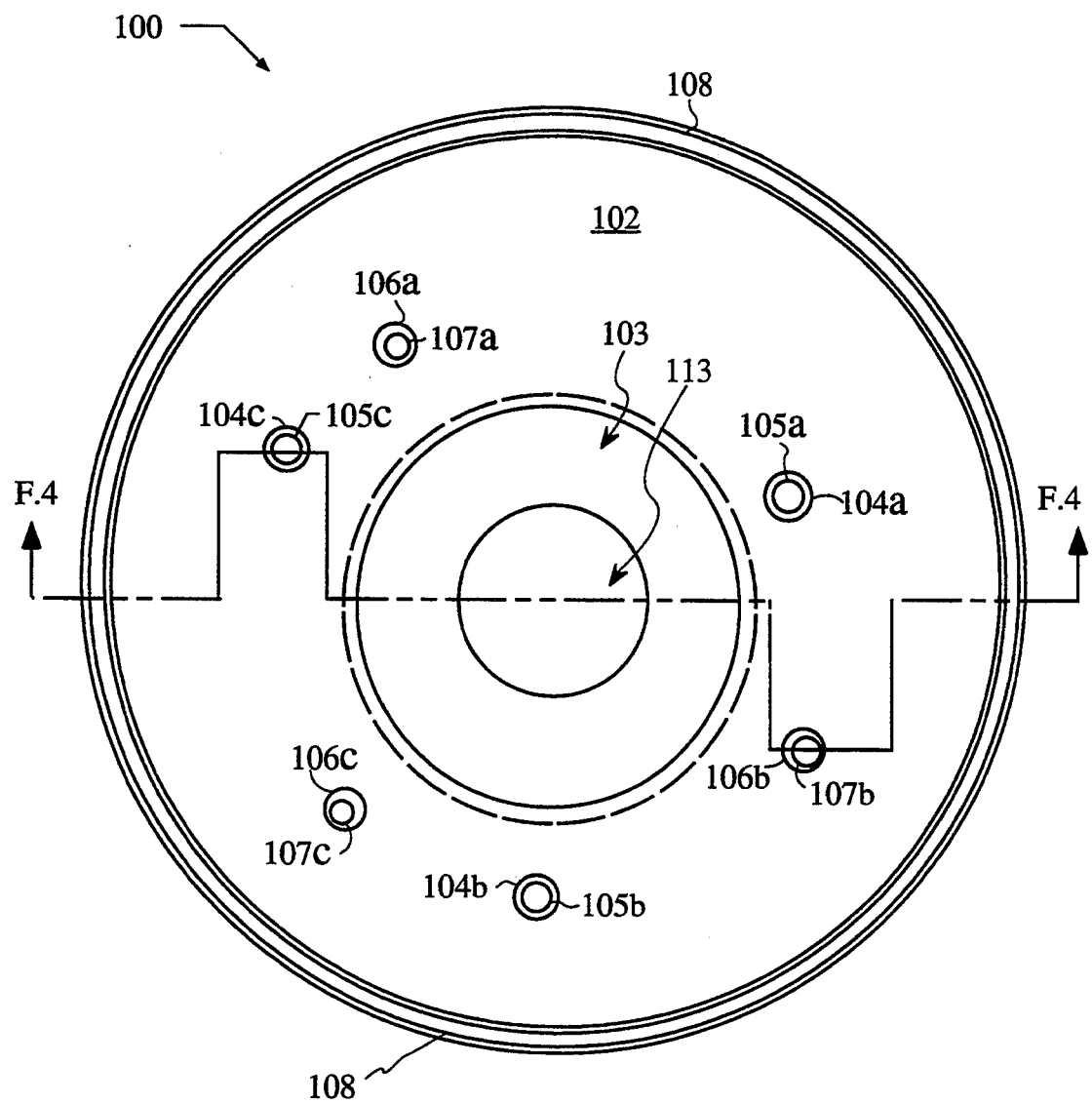
FIG. 3 is a top plan view of a pedestal base illustrative of the pedestal bases shown in FIG. 2.
Figure 4:
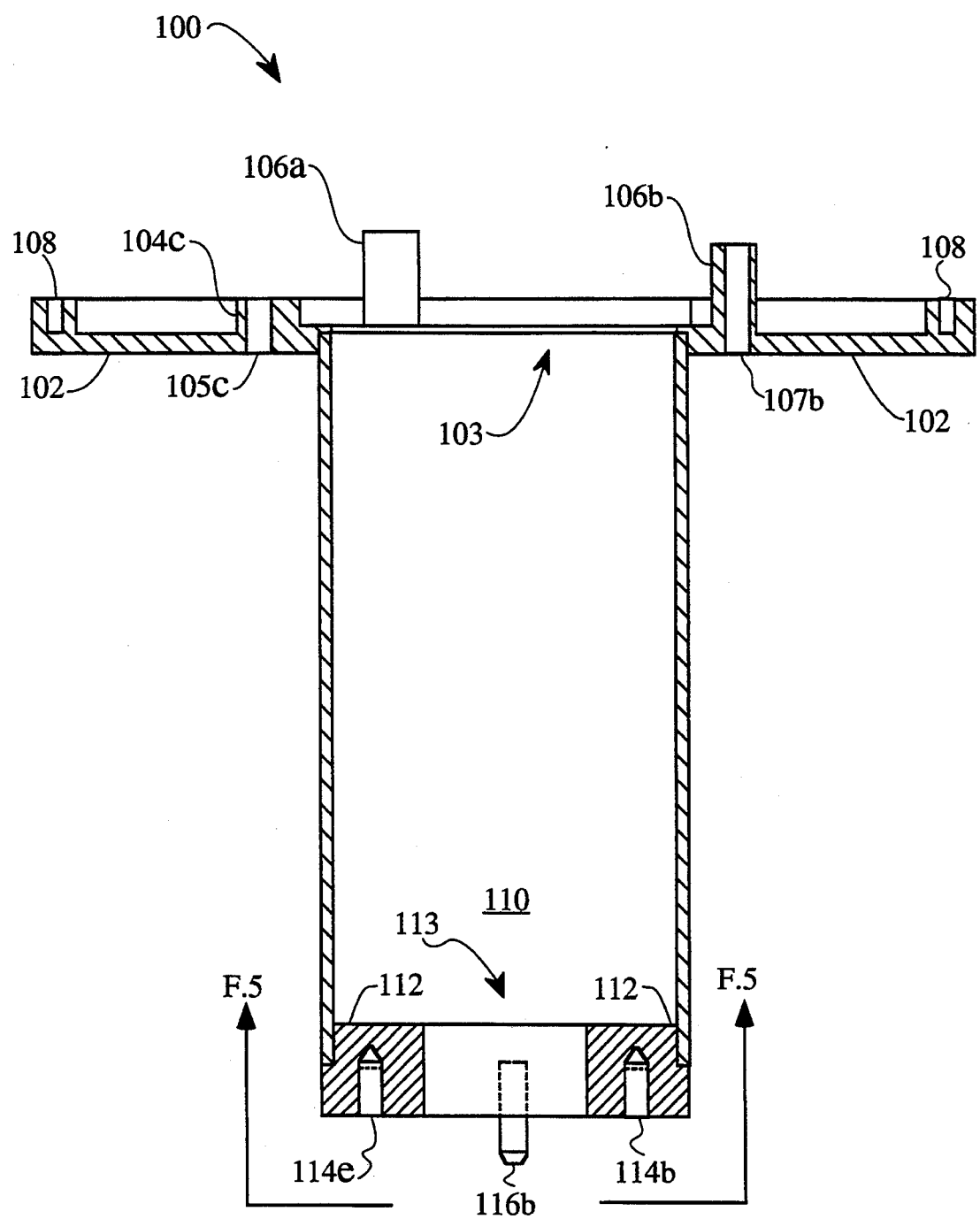
FIG. 4 is a cross-sectional view of the pedestal base of FIG. 3.
Figure 5:
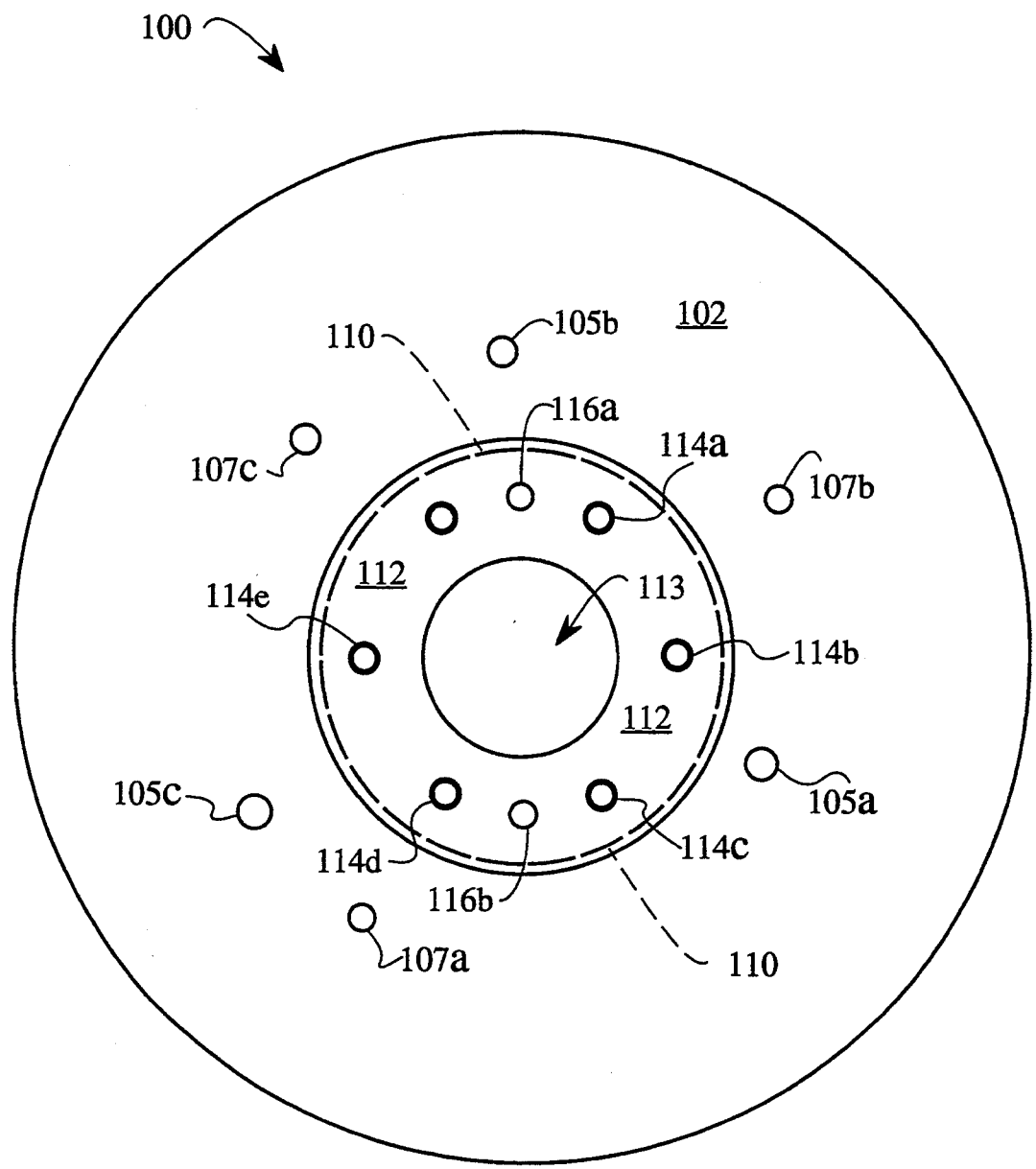
FIG. 5 is a bottom plan view of the pedestal base of FIG. 4.
Figure 8:
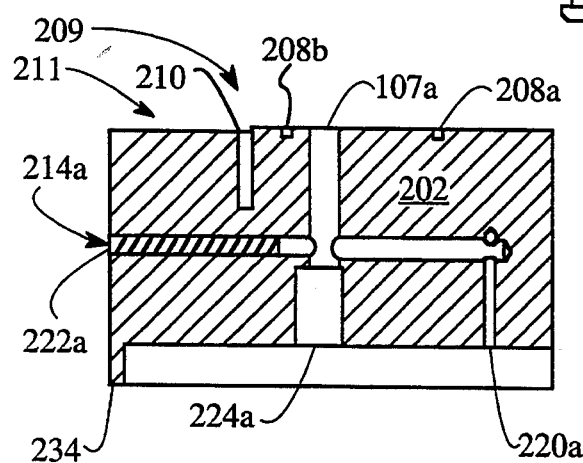
Figure 9:
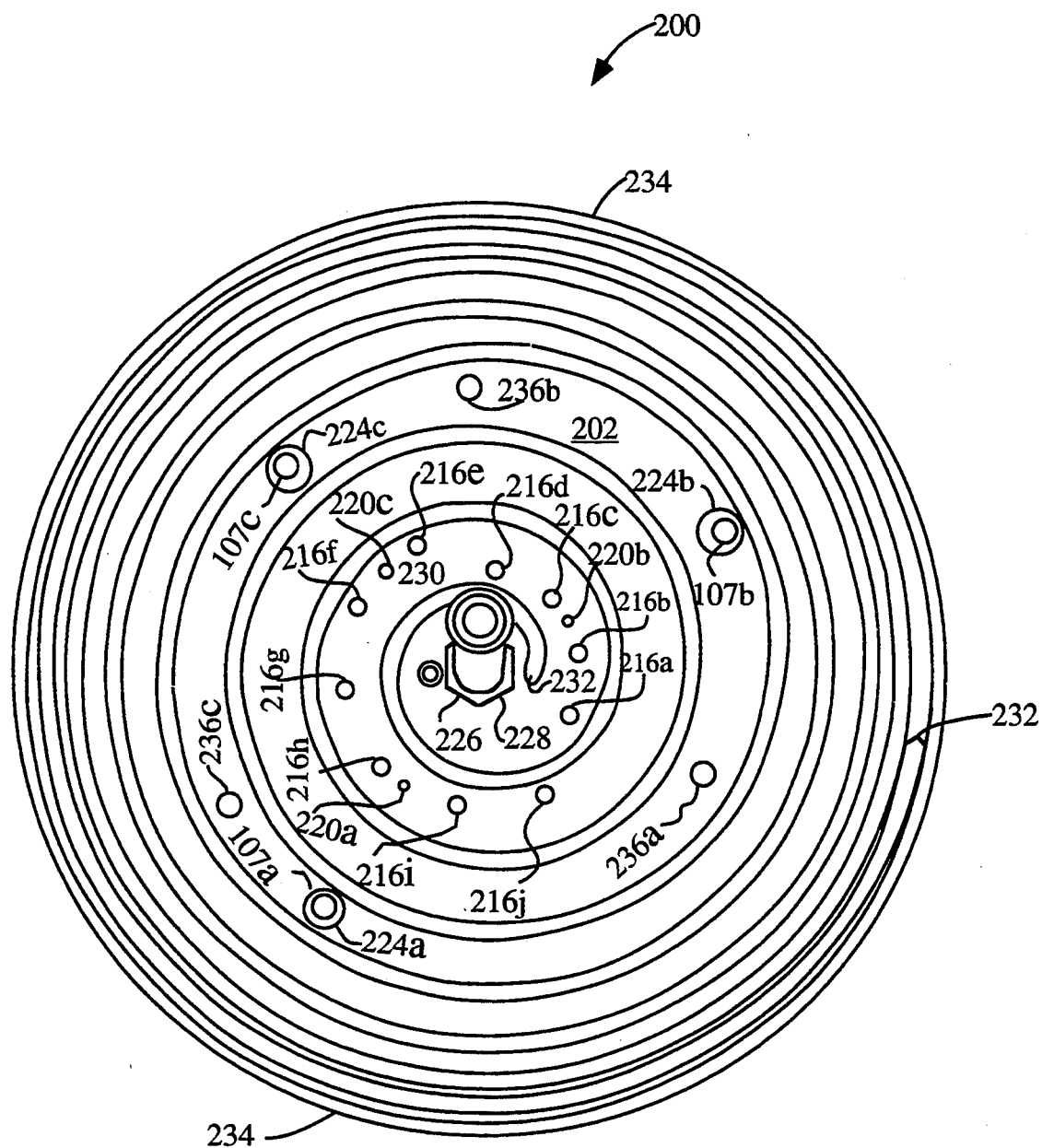
FIG. 9 is a bottom plan view of the platen of FIG. 6.

A pedestal base 100 illustrative of pedestal bases 16b, 16c and 16d is shown in detail in FIGS. 3, 4 and 5. In the top plan view of FIG. 3 and the bottom plan view of FIG. 5, the most prominent feature is the base plate 102. Base plate 102 is made of aluminum. Other suitable materials include certain metal or ceramic alloys, including stainless steel and nickel, that can be used in the reactive process environment without being degraded. Three holes 105a, 105b and 105c through base plate 102 and respective spacing sleeves 104a, 104b and 104c, which protrude from base plate 102, accommodate screws (not shown) used to connect illustrative platen assembly 200 (FIG. 6) to the base pedestal 100. The outside diameter of the spacing sleeves 104a-104c is 0.31 inches, and the top of spacing sleeves 104a-104c is 0.41 inches from the bottom surface of the base plate 102. Three other holes 107a, 107b and 107c through base plate 102 and respective index sleeves 106a, 106b and 106c are 0.19 inches in diameter for accommodating wafer lifting pins such as, for example, pins 20c, 21c and 22c of FIG. 2. Sleeves 106a-106c are 0.31 inches in diameter and rise 0.75 inches from the upper surface of the base plate 102 to engage respective holes 224a-224c of platen 200 (FIGS. 8 and 9). Holes 107 are 0.19 inches in diameter and eccentric with respect to their respective sleeves 106, although they may be concentric if desired. An annular groove 108 is provided in base plate 102 to accommodate the platen 200 and provide a seal between the platen 200 and the base pedestal 100. The top of groove 108 is 0.41 inches from the bottom surface of the base plate 102.

The pedestal 110 and pedestal mounting block 112 are visible in FIG. 4. Pedestal 110 is made of tubular aluminum or other suitable material, and is welded at its outside diameter to the bottom of the base plate 102 at a circular opening provided therein. The annular mounting block 112 also is aluminum or other suitable material, and is provided with pin holes 114a-114f and index pins 116a and 116b for mounting on the floor of the process chamber in any suitable manner. The mounting block 112 is inserted into the pedestal 110 and welded thereto.

Figure 6:
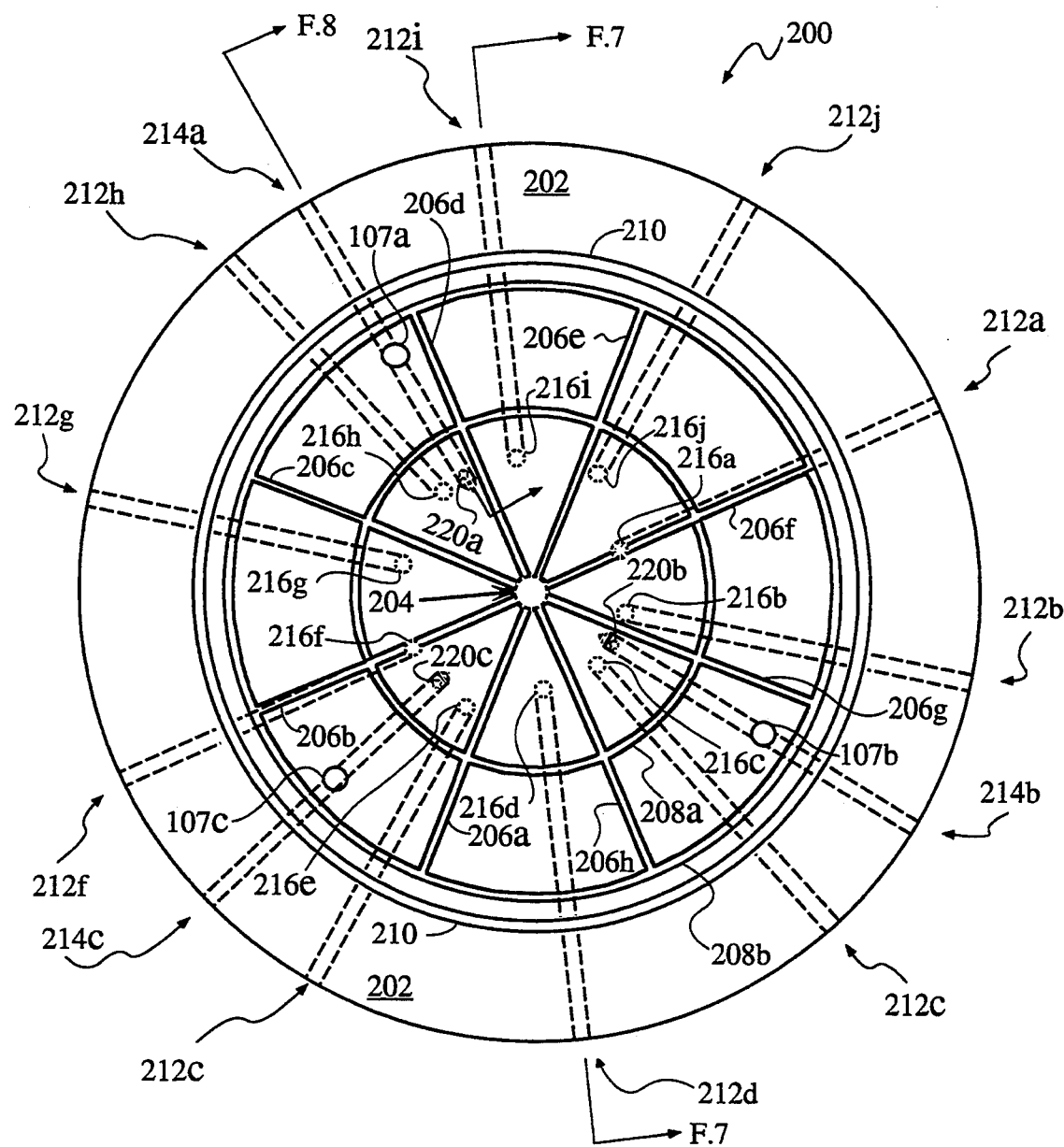
FIG. 6 is a top plan view of a platen illustrative of the platens shown in FIG. 2.
Figure 7:
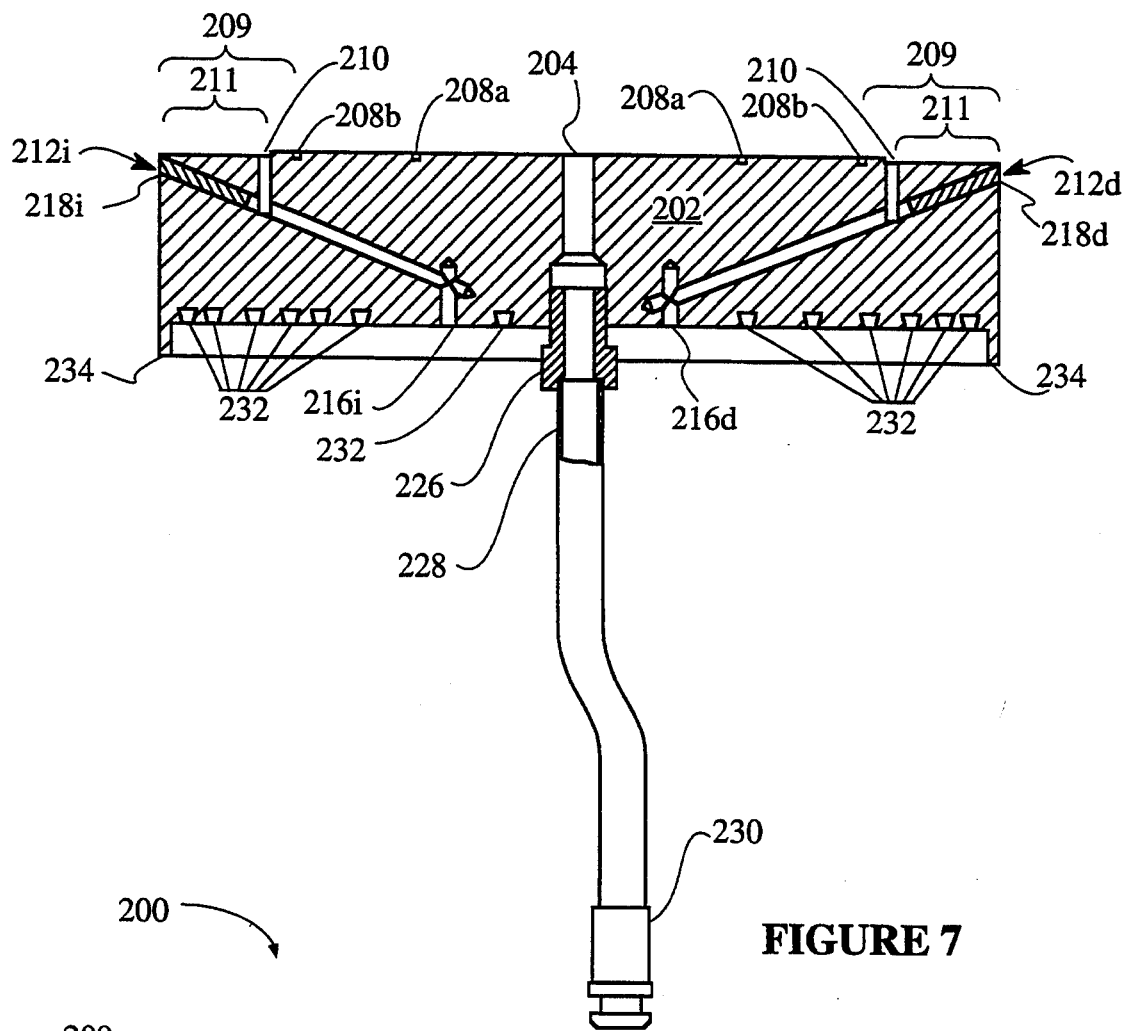
FIGS. 7 and 8 are views through different cross-sections of the platen of FIG. 6.

An illustrative platen 200 is shown in FIGS. 6, 7 and 8. The major component of the platen 200 is a circular block 202 of aluminum or other suitable material such as stainless steel. As viewed from the top, the upper surface of the platen block 202 is provided with a vacuum line 204, which appears as a central orifice from which radial vacuum grooves 206a-206h extend. The vacuum line 204 is 0.25 inches in diameter, and extends through the platen block 202. The radial grooves 206a-206h are rectangular in cross section, although other shapes are suitable as well, and are 0.06 inches deep and 0.06 inches wide. The eight radial grooves 206a-206h are regularly disposed at forty-five degree angles from one another. Radial grooves 206a-206h intersect concentric annular vacuum grooves 208a and 208b, which like the radial grooves 206a-206h are rectangular in cross section and measure 0.06 inches deep and 0.06 inches wide. The outer radius of the inner annular groove 208a is 1.41 inches, and the outer radius of the outer annular groove 208b is 2.40 inches. An annular gas groove 210 is provided in the peripheral region of the top surface of platen block 202. The annular groove 210 is rectangular in cross section, measuring 0.09 inches wide and 0.50 inches deep. The outside radius of the gas groove 210 is 2.64 inches.

The gas groove 210 is provided within a peripheral region 209 of the top surface of the platen block 202 outside of the outermost annular vacuum groove 208b. As shown in FIG. 7, a portion 211 of the peripheral region 209 is depressed with respect to the top surface of the platen block 202. The depression shown in FIG. 7 is 0.01 inches. Other configurations of the peripheral region 209 include having portion 211 level with or elevated above the top surface of the platen block 202, and providing a baffle in the form of an annular ridge or ledge just beyond the diameter of the wafer to be processed.

The gas groove 210 intersects a network of radial gas lines 212a-212j for distributing gas to the backside of the wafer to be processed. Radial gas lines 212a-212j are shown in hidden lines in FIG. 6, and selectively in cross section in FIG. 7. Lines 212a-212j are radially distributed in the platen block 202 at 36 degree intervals. Each of the bores for the ten gas lines 212a-212j is 0.13 inches in diameter, begins in the vertical edge of the platen block 202 at a distance of 0.11 inches from the top surface of the platen block 202 to the bore centerline, is angled twenty degrees from the top surface of the platen block 202, and extends sufficiently into the platen block 202 to intersect a respective one of the ten vertical bores for gas lines 216a-216j, which extend from the bottom surface of the platen block 202 (FIG. 9). The gas lines 212a-212j are plugged by respective plugs 218a-218j (see, e.g., plugs 218d and 218i in FIG. 7), which extend 0.75 inches from the outside vertical edge of the platen block 202 to just short of the gas groove 210. The plugs 218a-218j are slip fitted and welded on the outside surface of the platen block 202. The diameter of the bores for gas lines 216a-216j is 0.13 inches.

A second network of radial gas lines 214a-214c are bored in the platen block 202 for distributing backside gas to holes 107a-107c, which accommodate wafer lift pins such as 20c, 21c and 22c shown in FIG. 2. Radial gas lines 214a-214c are shown in hidden lines in FIG. 6, and selectively in cross section in FIG. 8. Each of the bores for the three gas lines 214a-214c is 0.13 inches in diameter, begins in the vertical edge of the platen block 202 a distance 0.76 inches from the top surface of the platen block 202 to the bore centerline, is parallel to the top surface of the platen block 202, and extends sufficiently into the platen block 202 to intersect a respective one of the three vertical bores for gas lines 220a-220c, which extend from the bottom surface of the platen block 202 (FIG. 9). The gas lines 214a-214c are plugged by respective plugs 222a-222c (see, e.g., plug 222a in FIG. 8), which extend 0.75 inches from the outside vertical edge of the platen block 202 to just short of the respective gas lines 220a-220c. The plugs 222a-222c are slip fitted and welded on the outside of the platen block 202. The diameter of the bores for gas lines 220a-220c is 0.06 inches.

Holes 107a-107c, which accommodate wafer lift pins such as 20c, 21c and 22c shown in FIG. 2, are 0.19 inches in diameter and pass through platen block 202. Toward the bottom surface of the platen block 202, holes 107a-107c merge into, respectively, index holes 224a-224c, which are 0.31 inches in diameter and provided to receive respective index sleeves 106a-106c of the base pedestal 100 (FIG. 3). The center axes of holes 107a-107c are offset from, respectively, the center axes of holes 224a-224c, to accommodate the eccentricity between holes 107a-107c and sleeves 106a-106c.

The platen 200 also accommodates vacuum line 204, which is a 0.25 inch bore drilled through the center of the platen block 202. Toward the bottom surface of the platen block 202, vacuum line 204 merges with a hole which receives an aluminum press-fit fixture 226, which is welded to the platen. The fixture 226 has a channel through it for receiving aluminum tube 228, which is welded to it. At its other end, tube 228 is welded to a suitable aluminum vacuum fitting 230.

Figure 10:
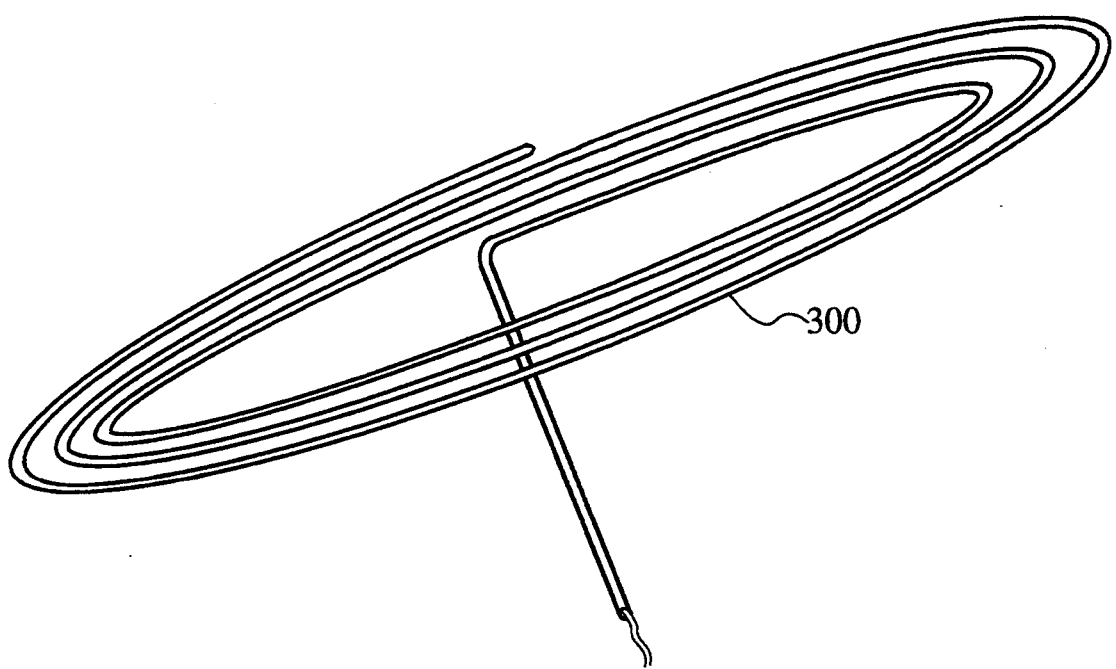
FIG. 10 is a plan view of a heating element.

The bottom of platen block 202 is provided with a spiral groove 232, to accommodate a heating element such as element 300 shown in FIG. 10. The groove 232 is variably pitched to provide a uniform distribution of heat in the platen 200, and is suitably sized to receive heating element 300. The heating element 300 is made of any suitable soft heat-conductive material, and is slip- or press-fitted into the platen block 202. The resistance of the fit and the radial force exerted by the spiral act to securely retain the heating element 300 in the groove 232.

The base pedestal 100 is assembled to the platen 200 by aligning the index sleeves 106a-106c extending from the top of the base plate 102 with the index holes 224a-224c in the bottom of the platen block 202, and bringing together the pedestal base 102 and the platen 200 so that annular flange 234 extending from the bottom of block 202 is set within the annular groove 236 in the base plate 102. The annular flange 234 has an inside diameter of 6.91 inches, and is 0.18 inches wide and 0.259 inches in length. The groove 108 has an inside diameter of 6.81 inches and an outside diameter of 7.01 inches; hence is 0.20 inches wide. The tip of flange 234 and the bottom of groove 108 are serrated in a mating pattern for providing a gas seal. The base pedestal 100 and the platen 200 are secured to one another by the use of screws (not shown), which passed through holes 105a-105c from the bottom of the base plate 102 (FIG. 5) and engage respective threaded holes 236a-236c in the bottom of the platen block 202.

It will be appreciated that the base pedestal 100 and the platen 200 may be made by a variety of different techniques. For example, the base pedestal 100 and platen 200 may be machined from a single block of material, or the base pedestal 100 may be manufactured with a different shape, or the platen 200 may be assembled from a variety of tubes and plates. In the event that the base pedestal 100 and the platen 200 are separate components, they may be joined by any number of different techniques, including welding, clamping, and gluing.

Although load/lock station 5 as shown is different from the process stations 4a-4e, it will be understood that load/lock station 5 could be nearly identical to the process stations 4a-4e, retaining the major components thereof, including the lift pin holes 107a-107c, but lacking the groove 210 and the various gas lines 212a-212j and 216a-216j of the backside gas system, and the various grooves 206a-206h and 208a-208b and gas line 204 of the vacuum chuck system. Alternatively, the load/lock station 5 could be identical to the process stations 4a-4e for providing additional processing capability.

A variety of materials including tungsten, tungsten silicide, and titanium nitride are deposited on a wafer using the apparatus of FIGS. 1 and 2 as follows. The wafer to be processed is introduced into the process chamber 2 from the load lock chamber 1 at a reduced pressure such as 40 Torr, and is received at an empty load/unload station 5 and lowered onto raised lift pins 20f, 21f and 22f. By coordinating the rotation of wafer transport mechanism 10 and the raising and lowering of the lift pins 20a-20f, 21a-21f, and 22a-22f, the wafers are transported to successive ones of the stations 4a-4e and 5. The wafer at the load/lock station 5, which is fully processed, is removed into the load lock chamber 1.

The pins 20a-20f, 21a-21f, and 22a-22f at the stations 4a-4e and 5 now lowered, depositing the wafers to be processed on respective platens 14a-14e under respective gas dispersion heads 12a-12e. Once the wafers are deposited on the respective platens 14a-14e, a suitable vacuum such as, for example, a pressure 20-40 Torr less than the process chamber pressure, is maintained in the vacuum clamps of the respective process stations 4a-4e. The term "vacuum" is used herein in a relative sense to mean a pressure less than another pressure, e.g. the pressure in the vacuum clamps at the respective process stations 4a-4e relative to a pressure in the process chamber 2. Each of the platens 14a-14e includes vacuum grooves such as radial grooves 206a-206h and annular grooves 208a-208b for holding a wafer in place on the surface of the platen block 202, thereby creating a vacuum clamp. The vacuum is exerted through vacuum line 204, tube 228, and fitting 230.

Once the vacuum clamps at stations 4a-4e are activated, a gas is introduced at the backside of the wafers at the stations 4a-4e. The introduction of the backside gas is coordinated with the introduction of a process gas at the gas dispersion heads 12a-12e. To better appreciate the function of the backside gas, consider the illustrative platen 200 of FIGS. 6-9. The backside gas is introduced into the space between the wafer backside and the surface of the platen block 202 in the peripheral region 209 (in the embodiment of FIGS. 7 and 8, the region 211) through annular groove 210, even if the peripheral region 209 is even with the top surface of the platen block 202. The combined force exerted through the vacuum grooves 206a-206h and 208a-208b and the gas dispersed directly upon the wafer, the latter being somewhat in excess of the process pressure in chamber 2, is sufficient to overcome the opposite force exerted by the backside gas pressure developed under the wafer in the peripheral region 209. The volume of backside gas furnished to the groove 210 is determined based on the desired rate of venting from underneath the wafer's edge and the effect of the backside gas on the wafer frontside deposition.

The backside gas vents from beneath the wafer's edge, which is disposed over the peripheral region 209, into the process chamber 2. In the process chamber 2, the backside gas mixes with the process gas and is vented through the vent ports 6a-6f. The presence of the backside gas over the peripheral region 209 and the outward flow from the peripheral region 209 past the wafer edge and into the process chamber 2 sufficiently impedes the process gas from reaching any portion of the wafer backside, thereby preventing backside deposition.

The backside gas also vents beneath the base plate 102 through the lifting pin holes 107a-107c, to prevent the process gas from reaching the area around the lifting pins and the wafer backside through the lift pin holes 107a-107c.

The backside gas is introduced into the interior volume of the pedestal 110 through orifice 113 in the block 112, and into the interior volume under the platen block 202 and about the heating element 300 through the orifice 103 in the base plate 102. From the interior volume of the pedestal 110 and under the platen block 202, the backside gas enters gas lines 216a–216j and flows from there to groove 210 through respective gas lines 212a–212j. The backside gas also enters gas lines 220a–220c, from which it flows to lift pin holes 107a–107c through respective gas lines 214a–214c. As gas lines 220a–220c are smaller than gas lines 216a–216j, the flow through them is relatively restricted. The backside gas is heated both within the volume under the platen block 202 and as it flows through the various gas lines.

A variety of process gases and backside gases may be selected. For example, in depositing a tungsten film at a deposition rate of 2000 A/min, for example, the product reactant $WF_6$ is used under the reactant conditions of $H_2$ and Ar at a deposition temperature of 400 degrees C. and an operating pressure of 40 Torr. In the apparatus of FIGS. 1 and 2, the flow of process gas to each of the dispersion heads 12a–12e is on the order of two standard liters per minute. The actual pressure on the wafer being processed is somewhat greater than 40 Torr because the gas stream from the dispersion head impinges directly on the surface of the wafer. Under these process conditions, a suitable backside gas is Argon or a mixture of Argon and Hydrogen in proportion to the mixture of Argon and Hydrogen introduced through the gas dispersion heads 12a–12e into the process chamber 2. The various constituent gases are delivered to and mixed in a suitable manifold, as is well known in the art. The flow of backside gas provided to each of the process stations 4a–4e under such conditions ranges from about 500 standard cubic centimeters per minute to about 3 standard liters per minute.

Uniformity of deposition near the edge of the wafers being processed is further improved by mixing a reactant gas with the selected inert gas or gases to obtain the backside gas. In the example of the preceding paragraph in which the product reactant $WF_6$ is used with the reactant gas $H_2$ and the carrier gas Ar or $N_2$ or a mixture of Ar and $N_2$, improved uniformity of edge deposition is obtained by mixing the reactant gas $H_2$ with Ar or $N_2$ or a mixture of Ar and $N_2$ to obtain the backside gas. The proper proportion of reactant gas to inert gas is determined empirically, as follows. Optimize the process gas mixture (e.g. $WF_6+H_2+Ar$) for the desired results at the center of the wafer. Adjust the backside gas mixture so that the proportion of reactant gas to carrier gas (e.g. $H_2$:Ar) is reproduced in the backside gas mixture (e.g. $H_2+Ar$). Vary the proportion of gases in the backside gas (e.g. $H_2$:Ar) through several wafer test runs to determine which proportion yields the best uniformity, and select that proportion for production. From ten to twenty percent variation from the starting proportion to the final determined proportion is to be expected.

Suitable inert gases for use in the backside gas mixture include argon, nitrogen, helium, freon, $C_2F_6$, or $CF_4$, or any suitable combination thereof. An inert gas is any gas that does not react adversely with the materials present in the process chamber 2 and in the gas distribution system, and that does not participate in the chemical reactions involved. Moreover, it is desirable that the thermal conductivity and heat capacity of the inert gas be sufficient to achieve good temperature uniformity across the wafers being processed.

While our invention has been described with respect to the embodiments and variations set forth above, these embodiments and variations are illustrative and our invention is not to be considered limited in scope to these embodiments and variations. For example, the various shapes and dimensions and the various flow rates and pressures set forth herein are illustrative, and other shapes, dimensions, flow rates, and pressures may also be effective for the intended purpose. Moreover, the deposition process discussed herein is illustrative, and other processes may also be effective for the intended purpose. Accordingly, other embodiments and variations not described herein are to be considered within the scope of our invention as defined by the following claims.

What is claimed is:

1. A method of protecting the backside of a substrate disposed in a process chamber during processing, comprising the steps of:
    restraining the substrate over a platen;
    introducing a process gas comprising a mixture of a product reactant gas, a first reactant gas, and a carrier gas into the process chamber;
    introducing a backside gas comprising a mixture of a second reactant gas and an inert gas into a peripheral space defined by a surface of the platen and a periphery of the substrate backside, the backside gas being a different gas than the process gas; and
    maintaining a positive pressure differential between backside gas pressure in the peripheral space and process gas pressure in the process chamber so that the backside gas vents from beneath the backside periphery of the substrate into the process chamber to exclude the process gas from contact with the backside periphery of the substrate.

2. A method as in claim 1, wherein the process gas mixture is optimized for deposition of a thin material layer over the substrate, wherein the first and second reactant gases are the same type of gas, and wherein the backside gas introducing step comprises the steps of:
    initially setting the proportion of the second reactant gas to the inert gas in the backside gas to be substantially equal to the proportion of the first reactant gas to the carrier gas in the process gas;
    introducing varying proportions of the second reactant gas to the inert gas in the backside gas while monitoring deposition uniformity near respective edges of a plurality of test wafers; and
    selecting one of the varying proportions of the second reactant gas to the inert gas in the backside gas that yields good deposition uniformity across a test wafer.

3. A method as in claim 2, wherein the carrier gas and the inert gas are the same type of gas.

4. A method as in claim 3, wherein the carrier gas and the inert gas are argon.

5. A method as in claim 3, wherein the carrier gas and the inert gas are a mixture of argon and nitrogen.

6. A method as in claim 1, wherein:
    in the process gas, the product reactant is $WF_6$, the reactant gas is hydrogen, and the carrier gas is argon; and
    in the backside gas, the reactant gas is hydrogen and the inert gas is argon.

7. A method as in claim 1, wherein:
    in the process gas, the product reactant is $WF_6$, the reactant gas is hydrogen, and the carrier gas is argon and nitrogen; and in the backside gas, the reactant gas is hydrogen and the inert gas is argon and nitrogen.

8. A method as in claim 1, wherein the inert gas is also a thermal gas.

9. A method as in claim 1, wherein the inert gas is selected from the group consisting of argon, nitrogen, helium, freon, $C_2F_6$, or $CF_4$, and any combination thereof.

10. A method of protecting the backside of a substrate disposed in a process chamber during processing, comprising the steps of:

applying a vacuum to a backside region of the substrate through a platen to restrain the wafer on the platen;

introducing a process gas comprising a mixture of a first reactant gas and a carrier gas into the process chamber;

introducing a backside gas comprising a mixture of a second reactant gas and an inert gas to a periphery of the substrate backside; and maintaining a positive pressure differential between backside gas pressure at the periphery of the substrate backside and process gas pressure in the process chamber.

11. A method as in claim 10, wherein the process gas mixture includes a product reactant gas and is optimized for a desired thin material layer at the center of the substrate, wherein the first and second reactant gases are the same type of gas, and wherein the backside gas introducing step comprises the steps of:

initially setting the proportion of the second reactant gas to the inert gas in the backside gas to be substantially equal to the proportion of the first reactant gas to the carrier gas in the process gas;

introducing varying proportions of the second reactant gas to said inert gas in the backside gas while monitoring deposition uniformity across a plurality of test wafers; and selecting one of the varying proportions of the second reactant gas to the inert gas in the backside gas that yields good deposition uniformity across the substrate.

12. A method as in claim 11, wherein the carrier gas and the inert gas are the same type of gas.

13. A method as in claim 12, wherein the carrier gas and the inert gas are argon.

14. A method as in claim 12, wherein the carrier gas and the inert gas are a mixture of argon and nitrogen.

15. A method of protecting the backside of a substrate disposed in a process chamber during processing, the substrate having a frontside to be processed and a backside, comprising the steps of:

applying a vacuum to a region of the substrate backside through a platen to restrain the wafer on the platen, introducing a process gas into the process chamber to establish a process gas pressure therein; and introducing a backside gas into a peripheral space defined by a surface of the platen and the periphery of the substrate backside, the backside gas being a different gas than the process gas and being introduced at a pressure in excess of the process gas pressure so that the backside gas vents from the peripheral region into the process chamber to exclude the process gas from contact with the backside periphery of the substrate.

16. A method as in claim 15 wherein the vacuum applying step comprises applying a vacuum to a circular interior region of the substrate backside, the substrate being circular and the circular interior region being concentric with the substrate.

* * * * *

UNITED STATES PATENT AND TRADEMARK OFFICE
CERTIFICATE OF CORRECTION

PATENT NO. : 5,374,594
DATED : December 20, 1994
INVENTOR(S) : Everhardus P. van de Ven, et. al.

It is certified that error appears in the above-indentified patent and that said Letters Patent is hereby corrected as shown below:

Column 2, line 46, after "chamber" insert --2--.

Signed and Sealed this

Eleventh Day of July, 1995

Attest:

BRUCE LEHMAN

Attesting Officer      Commissioner of Patents and Trademarks